(12) United States Patent
Sakschewski et al.

(10) Patent No.: US 11,808,794 B2
(45) Date of Patent: Nov. 7, 2023

(54) METHOD AND DEVICE FOR APPROXIMATELY DETERMINING VOLTAGES AT A HIGH-VOLTAGE SIDE OF A TRANSFORMER

(71) Applicant: SMA Solar Technology AG, Niestetal (DE)

(72) Inventors: Vitali Sakschewski, Gudensberg (DE); Thorsten Buelo, Kassel (DE); Florian Rauscher, Braunschweig (DE)

(73) Assignee: SMA Solar Technology AG, Niestetal (DE)

( * ) Notice: Subject to any disclaimer, the term of this patent is extended or adjusted under 35 U.S.C. 154(b) by 85 days.

(21) Appl. No.: 17/467,625

(22) Filed: Sep. 7, 2021

(65) Prior Publication Data

US 2021/0396790 A1 Dec. 23, 2021

Related U.S. Application Data

(63) Continuation of application No. PCT/EP2020/055818, filed on Mar. 5, 2020.

(30) Foreign Application Priority Data

Mar. 7, 2019 (DE) ...................... 10 2019 105 861.9

(51) Int. Cl.
*G01R 19/25* (2006.01)
*G01R 31/62* (2020.01)
(Continued)

(52) U.S. Cl.
CPC ......... *G01R 19/2513* (2013.01); *G01R 29/16* (2013.01); *G01R 31/42* (2013.01); *G01R 31/62* (2020.01)

(58) Field of Classification Search
CPC .... G01R 19/2513; G01R 29/16; G01R 31/42; G01R 31/62
(Continued)

(56) References Cited

U.S. PATENT DOCUMENTS

| 8,949,054 B2 | 2/2015 | Bjorn | |
| 10,067,167 B2* | 9/2018 | McEachern | ........ G01R 19/2513 |
| 11,557,899 B2* | 1/2023 | Premm | ...................... H02J 3/16 |
| 11,558,011 B2* | 1/2023 | Bettenwort | ............. H02S 50/00 |

(Continued)

FOREIGN PATENT DOCUMENTS

| EP | 3442106 A1 | 2/2019 |
| WO | 2014005619 A1 | 1/2014 |

OTHER PUBLICATIONS

International Search Report dated Jun. 2, 2020 in connection with PCT/EP2020/055818.
(Continued)

*Primary Examiner* — Giovanni Astacio-Oquendo
(74) *Attorney, Agent, or Firm* — Eschweiler & Potashnik, LLC

(57) ABSTRACT

The disclosure relates to a method and related device for approximately determining voltages at a high-voltage side of a transformer on the basis of measured voltages at a low-voltage side of the transformer. The method includes measuring delta voltages and phase voltages and phase angles at the low-voltage side of the transformer, transforming the phase voltages and phase angles into positive and negative phase sequence system voltages and phase angles of the positive and negative phase sequence systems, respectively, at the low-voltage side, determining positive and negative phase sequence system voltages and phase angles of the positive and negative phase sequence systems, respectively, at the high-voltage side from the positive and negative phase sequence system voltages and phase angles of the positive and negative phase sequence systems, respectively, at the (Continued)

low-voltage side, determining estimated values of a zero phase sequence system voltage and of a phase angle of a zero phase sequence system at the high-voltage side from the measured delta voltages and phase voltages and phase angles at the low-voltage side, and transforming the positive, negative and zero phase sequence system voltages and the phase angles into phase voltages and/or delta voltages at the high-voltage side of the transformer.

16 Claims, 3 Drawing Sheets

(51) Int. Cl.
    *G01R 29/16*      (2006.01)
    *G01R 31/42*      (2006.01)

(58) Field of Classification Search
    USPC .................................. 324/764.01, 537, 500
    See application file for complete search history.

(56) References Cited

U.S. PATENT DOCUMENTS

| | | | |
|---|---|---|---|
| 11,563,383 B2* | 1/2023 | Allert | H02J 3/26 |
| 2013/0241201 A1 | 9/2013 | Fortmann | |
| 2014/0254216 A1 | 9/2014 | Diedrichs | |
| 2017/0292999 A1* | 10/2017 | Turner | G01R 31/62 |
| 2018/0024180 A1 | 1/2018 | Putter | |
| 2022/0190581 A1* | 6/2022 | Chowdhury | G05B 19/056 |

OTHER PUBLICATIONS

Sulla F. ; Samuelsson O .: Estimation of the Zero Sequence Voltage on the D-Side of a DY Transformer by Using One Voltage Transformer on the D-Side. In: Proceedings of 2008 IET 9th International Conference on Developments in Power System Protection, 2008, S. 517-522.—ISSN: 0537-9989.

Bollen, M.H.J et al.; Characterization of Three-Phase Unbalanced Dips (as easy as one-two-three?); Chalmers University of Technology; Gothenburg, Sweden; 2000 IEEEE.

* cited by examiner

METHOD AND DEVICE FOR APPROXIMATELY DETERMINING VOLTAGES AT A HIGH-VOLTAGE SIDE OF A TRANSFORMER

CROSS REFERENCE TO RELATED APPLICATIONS

This application is a continuation of International Patent Application number PCT/EP2020/055818, filed on Mar. 5, 2020, which claims priority to German Patent Application number 10 2019 105 861.9, filed on Mar. 7, 2019, and is hereby incorporated by reference in its entirety.

FIELD

The disclosure relates to a method for the approximate determination of voltages at a high voltage side of a transformer on the basis of measured voltages at a low voltage side of the transformer. The disclosure further relates to a device, such as part of an inverter, suitable for performing the method.

BACKGROUND

Inverters are used in energy supply systems, for example, photovoltaic systems (PV systems), where they are used to convert direct current into grid-compliant alternating current suitable for feeding into a power supply grid. If galvanic isolation between the power supply grid and the inverter is desired or required by guidelines and legal regulations for certain power supply grids, a transformer is arranged between an AC output of the inverter and the power supply grid.

The use of transformers is essential, especially for larger photovoltaic systems that are directly connected to a medium-voltage grid. According to the normative specification "IEEE 1547", for example, it is required that fault conditions of the power supply grid be detected within the energy supply system and that after detecting certain fault conditions the energy supply system reacts to these and disconnects from the grid, for example. Such fault conditions are, for example, short circuits at the high voltage side of the transformer. Specifically, it is provided that an overshoot and/or undershoot of predetermined values for the line-to-line voltages (also called delta voltages) and/or the line-to-ground voltages (also called string voltages) are detected in order to infer fault conditions from this and to adjust the feed-in behavior of the inverter as required. It should be noted that certain types of transformers do not have a neutral line at the high voltage side or do not pass it on to the low voltage side, which means that no zero-sequence voltage is transmitted, representing a loss of information.

In order to be able to implement the required change in the feed-in behavior, knowledge of the various line-to-line voltages, as well as the line-to-ground voltages at the high voltage side of the transformer, is a prerequisite.

However, measuring these voltages may be very complex and cost-intensive due to the high voltage level, for example, if the transformer is connected on its high voltage side to a medium-voltage grid with voltages in the range of 20 kV (kilovolts). In some grid systems, it is therefore permissible to make the feed-in behavior of the inverter dependent on voltage levels on the low voltage side of the transformer. However, particularly for transformer types where a zero-sequence voltage is not transmitted, the voltage conditions at the low voltage side of the transformer do not adequately reflect the voltage conditions at the high voltage side of the transformer. In that case, a fault determination performed directly based on voltage measurements at the low voltage side of the transformer may not correctly detect a fault that occurred at the high voltage side of the transformer. For a correct fault detection, it is essential to know as accurately as possible the voltage conditions at the high voltage side of the transformer.

In the article "Characterization of Three-Phase Unbalanced Dips" by Bollen and Styvaktakis, IEEE, 2000 Power Engineering Society Summer Meeting (Cat. No. 00CH37134), Seattle, Wash., 2000, pp. 899-904, vol. 2, a method is described for making qualitative statements about fault conditions at the high voltage side of a transformer based on measured voltages at a low voltage side of the transformer. However, merely qualitative statements are not suitable for implementing concrete criteria related to voltage values at the high voltage side of the transformer.

SUMMARY

The present disclosure is directed to a method and a device (e.g., an inverter) with which the voltage conditions at a high voltage side of a transformer can be reliably quantified on the basis of the voltage conditions at the low voltage side, such that fault detection for the high voltage side of the transformer can be performed even without measuring the voltage values at the high voltage side of the transformer.

A method according to the disclosure comprises measuring delta voltages, string voltages and phase angles at the low voltage side of the transformer and transforming the string voltages and phase angles into positive and negative sequence voltages and phase angles of the positive and negative sequence systems, respectively, at the low voltage side. The method then comprises determining positive and negative sequence voltages and phase angles of the positive and negative sequence systems, respectively, at the high voltage side from the positive and negative sequence voltages and phase angles of the positive and negative sequence systems, respectively, at the low voltage side. The method further comprises determining an estimate of the zero-sequence voltage and a phase angle of a zero-sequence system at the high voltage side from the measured delta voltages, string voltages, and phase angles at the low voltage side and by transforming the positive, negative, and zero-sequence voltages and phase angles into string voltages and/or delta voltages at the high voltage side of the transformer.

Voltages at the low voltage side of the transformer are, for example, the voltages applied to terminals of an inverter coupled to a power supply grid via the transformer. Accordingly, a device configured to perform the method according to the disclosure may be arranged at output terminals of an inverter or may be integrated into an inverter.

The method according to the disclosure is based on the basic idea that a determination of the voltages at the high voltage side in a rotating coordinate system is advantageous, since two of three required voltages, namely those of the positive and negative sequence systems, respectively, as well as the corresponding phase angles can be obtained from the corresponding measurable values of the low voltage side. Thus, only for the corresponding parameters of the zero-sequence system an estimation has to be made.

In one embodiment of the method, the positive and negative sequence voltages at the high voltage side of the transformer are set equal to the positive and negative sequence voltages at the low voltage side. In doing so, a correction value can be added optionally. In one embodiment, the phase angles of the positive or negative sequence systems at the high voltage side are set from the phase angles at the low voltage side, wherein a phase correction value is added that is n times 30° for the positive sequence system and n times −30° for the negative sequence system. Here, n is an integer value that depends on the type of transformer. In particular, the value of n is chosen to be dependent on or even equal to a transformer shift of the transformer. Except for the optional correction value for the voltages mentioned above, the four required voltage parameters at-the high voltage side can thus be specified directly.

In another embodiment of the method, in order to determine an estimated value of the zero-sequence voltage and the phase angle of the zero-sequence system at the high voltage side on the basis of the measured delta voltages and string voltages at the low voltage side, a qualitative fault determination is carried out, by means of which the presence of a fault on one or more of the phases of the high voltage side can be concluded and by means of which a ground fault of one of the phases of the high voltage side can be detected. Here, it is at first determined only qualitatively on which phase or phases a fault is present.

Advantageously, in doing this, a minimum voltage can be determined from the measured delta voltages and string voltages for qualitative fault analysis, wherein a comparison of the measured delta voltages and string voltages with the minimum voltage indicates a faulty phase at the high voltage side. Furthermore, for qualitative fault determination, a maximum voltage can be determined from the measured delta voltages and string voltages, wherein a comparison of the maximum voltage with a comparison value that is characteristic for the grid at the high voltage side to which the transformer is connected indicates a ground fault at the high voltage side. The comparison value can thereby be selected depending on a sub-transient short-circuit power of the grid.

As a result, a qualitative fault analysis can be used to determine whether there is a single-pole or a double-pole short circuit at the high voltage side and/or whether there is a single-pole or a double-pole ground fault.

A subsequent estimation of parameters of the zero-sequence voltage system can be performed on the basis of a result of the qualitative fault analysis with higher quality. In one embodiment, in the presence of a single-pole ground fault, the value for the zero-sequence voltage at the high voltage side is set equal to the product of the negative-sequence voltage and the square root of the positive-sequence voltage. In the presence of a two-pole short-circuit, the value for the zero-sequence voltage at the high voltage side is set equal to zero. In the case of a two-pole ground fault, on the other hand, the value for the zero-sequence voltage at the high voltage side is set equal to the quotient of the square of the negative-sequence voltage and the positive-sequence voltage.

In another embodiment of the method, the value for the phase angle in the zero-sequence system at the high voltage side is set equal to the phase angle in the negative sequence system at the high voltage side, plus a phase offset that is 0°, 120° or −120°, depending on which phase at the high voltage side the qualitatively determined fault is present.

BRIEF DESCRIPTION OF THE DRAWINGS

The disclosure is explained in more detail below by means of an example of an embodiment with the aid of figures. The figures show.

DETAILED DESCRIPTION

Figure 1:
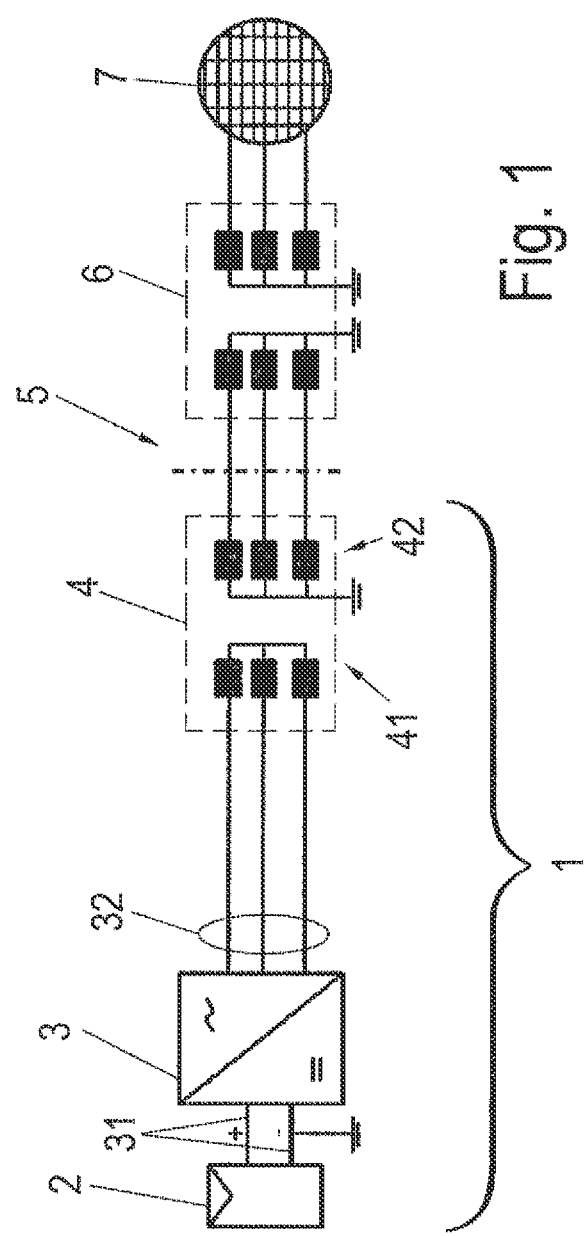
FIG. 1 a schematic representation of a PV system connected to a power supply grid.

FIG. 1 shows a block diagram of a PV system 1 as an example of a decentralized energy supply system. The PV system 1 comprises a PV generator 2 that is connected to an inverter 3 via a DC input 31. The inverter 3 is connected to a primary side 41 of a transformer 4 via AC outputs 32. In the example shown, the transformer 4 is a medium-voltage transformer that provides voltages in the range of about 20 kV on its secondary side 42 and is correspondingly connected to a medium-voltage grid 5 as a power supply grid.

The structure of the PV system 1 is shown in FIG. 1 as an example and in simplified form. In a PV system 1 feeding directly into the medium-voltage grid 5, the PV generator 2 symbolized in FIG. 1 only by the symbol of a PV cell usually comprises a large number of PV modules, several of which are connected in series to form so-called PV strings, which in turn are each connected in parallel to the inverter 3. In systems of this type, the inverter 3 is usually embodied as a central inverter. In the example shown, the inverter 3 is of three-phase design, as is usual in connection with medium-voltage grids 5. In FIG. 1, only the parts of the PV system 1 that are essential in context with the disclosure are shown. Other elements arranged on the DC or AC side of the inverter 3, such as disconnecting or switching elements, filters or monitoring devices, are not shown for reasons of clarity.

Usually remote from the PV system 1, a (high-voltage) transformer 6 is provided in the further course of the medium-voltage grid 5, via which the medium-voltage grid 5 is connected to a high-voltage grid 7 that serves as a higher-level power supply grid.

The galvanic isolation of the primary side 41 of the transformer 4 from the secondary side 42 allows separate grounding of the PV system 1, which is often required by operators of the power supply grid 7, here shown as an example by connecting a negative pole of the PV generator 2 to a ground potential.

At the low voltage side, the transformer 4 has windings in a star-shaped arrangement on its primary side 41 connected to the inverter 3. A neutral line connection is not led out at the low voltage side. On the secondary side 42 at the high voltage side of the transformer, the windings are also connected in a star configuration, with a neutral line connection led out separately and serving as the ground connection. The transformer 4 is thus a YNy transformer.

Figure 2:
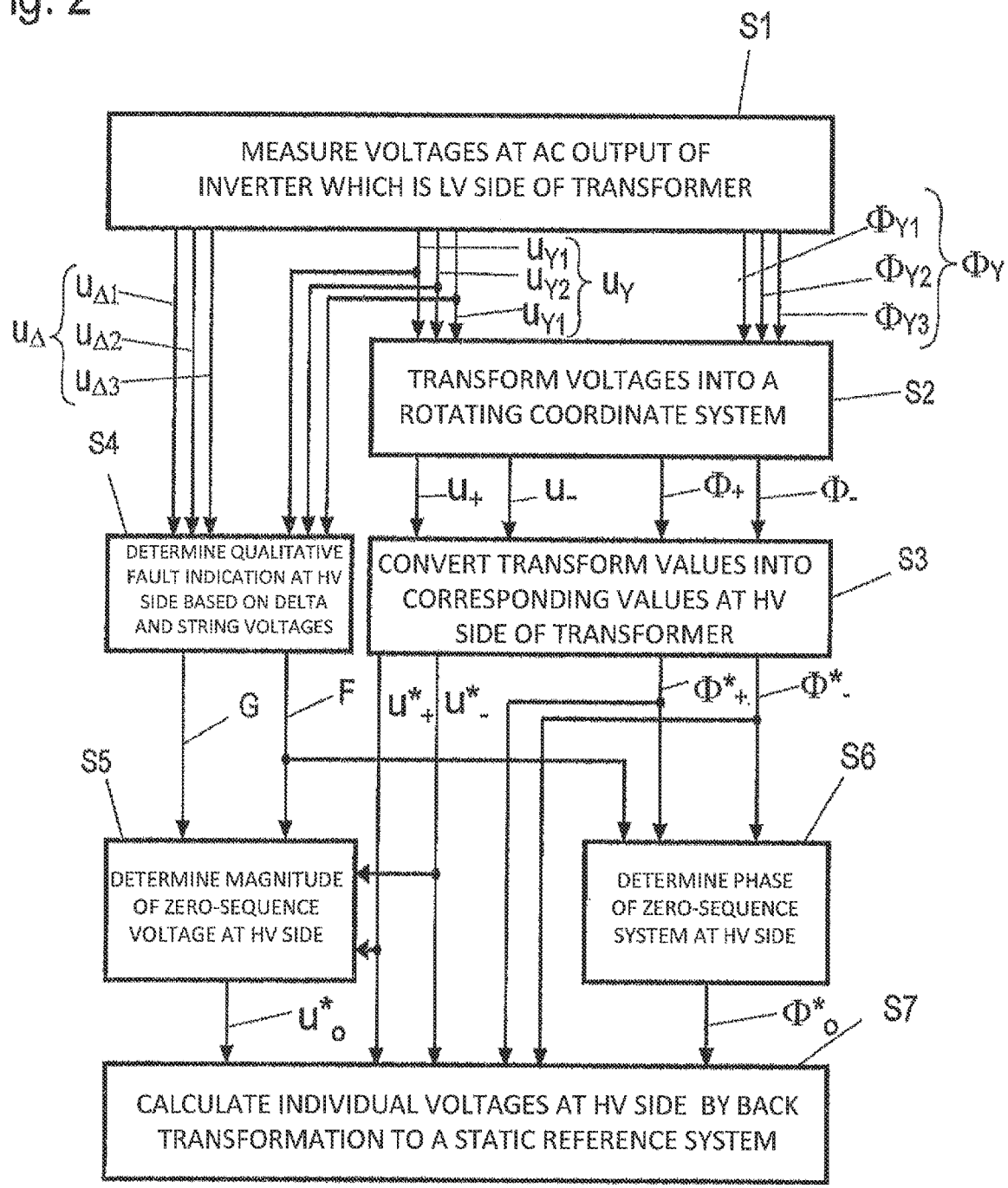
FIG. 2 a schematic flow chart of an embodiment of a method according to the disclosure.

In order to be able to implement requirements with regard to fault detection in the medium-voltage grid 5, according to the disclosure, it is intended to determine voltages at the high voltage side (secondary side 42) from measured voltages at the low voltage side (primary side 41) of the transformer 4 by means of an estimate. The voltages at the primary side 41 of transformer 4 can be measured, for example, in the region of the transformer-side connections of inverter 3. A method appropriate for estimating the voltages at the high voltage side in accordance with the disclosure is shown in FIG. 2 in the form of a flow chart. As an example, the method is explained on the basis of the PV system according to FIG. 1.

In a first act S1, voltages are measured at the AC output 32 of the inverter 3 and thus at the low voltage side of the transformer 4. Specifically, these are the so-called delta voltages $U_\Delta$ between two of the conductors (hereinafter also referred to as phases), as well as string voltages $U_Y$ between a conductor and an (artificial) neutral line, and phase angles $\phi_Y$ associated with these string voltages. Specifically, three delta voltages $U_\Delta$ are measured, a first delta voltage $U_{\Delta 12}$ between a first and second phase, a second delta voltage $U_{\Delta 23}$ between the second and a third phase, and a third delta voltage $U_{\Delta 31}$ between the third and the first phase. When the delta voltages $U_\Delta$ are referred to in the following, the three mentioned voltages are comprised.

The string voltages $U_Y$ also comprise three voltage values, namely a first string voltage $U_{Y1}$ measured between the first phase and the artificial neutral line, a second string voltage $U_{Y2}$ measured between the second phase and the artificial neutral line, and a third string voltage $U_{Y3}$ measured between the third phase and the artificial neutral line. Again, in the following, the string voltages $U_Y$ are understood to be the three values mentioned. In one embodiment, a node that is connected to the three phases via three equal resistors can, for example, be regarded as an artificial neutral line.

Also, the phase angles $\phi_Y$ include three values, a first phase angle $\phi_{Y1}$ indicating a phasing of the first string voltage $U_{Y1}$, a second phase angle $\phi_{Y2}$ indicating a phasing of the second string voltage $U_{Y2}$, and a third phase angle $\phi_{Y3}$ indicating a phasing of the third string voltage $U_{Y3}$.

In act S2, a transformation of the measured time-dependent voltage measurement signals that are represented by the string voltages $U_Y$ and the phase angles $\phi_Y$ into a rotating coordinate system is performed. The representation of the measured quantities in the rotating coordinate system is carried out in the form of a positive sequence voltage system and a negative sequence voltage system, each of which is specified by a complex value in terms of magnitude and phase. Thus, in act S2 a positive sequence voltage magnitude u+ and a positive sequence voltage phase angle $\phi$+ are determined from the mentioned input quantities of the string voltages $U_Y$ and the phase angles $\phi_Y$. Furthermore, a negative sequence voltage magnitude u- and a negative sequence voltage phase angle $\phi$- are determined.

The four values determined in act S2 are converted in a next act S3 into corresponding values at the high voltage side (secondary side 42) of the transformer 4. In the following, voltage values referring to the high voltage side of the transformer are marked by a superscript asterisk (*).

In one embodiment, the conversion of the symmetrical components (i.e., the positive sequence components and negative sequence components) of the low voltage side to the high voltage side is based on the assumption that the magnitudes of the positive sequence voltages and negative sequence voltages do not change between the low voltage side and the high voltage side of the transformer. In a further embodiment, correction values c+ or c- can be taken into account for the positive and negative sequence systems. Thus, for the positive and negative sequence voltages at the high voltage side this results in:

$$u_+^* = u_+ + c_+$$

$$u_-^* = u_- + c_-$$

Depending on the circuit topology of the transformer, phase angles $\phi^*+$ or $\phi^*-$ at the high voltage side of the transformer differ from the corresponding phase angles $\phi$+ or $\phi$- by a number of n multiples of 30°. The quantity n depends on the circuit topology of the transformer and is also called transformer shift. This results in:

$$\Phi^*_+ = \Phi_+ + n \cdot 30°$$

$$\Phi^*_- = \Phi_- - n \cdot 30°$$

In a next act S4, which can be carried out in parallel or substantially in parallel with acts S2 and S3, a qualitative indication of a fault at the high voltage side is determined on the basis of the delta voltages $U_\Delta$ and the string voltages $U_Y$. In this context, act S4 is not used for a direct indication of a fault that may be present at the high voltage side, but is performed to enable the estimation of voltages at the high voltage side of the transformer, which will ultimately be used for fault detection. This will be explained in more detail in connection with acts S5 and S6.

In act S4, it is qualitatively determined whether a fault is present on one of the phases at the high voltage side and it is determined whether the observed fault is a ground fault. Depending on the result in act S4, an information F is determined, which indicates whether and on which phase or phases a fault is present. Further, an information G is determined, which indicates a ground fault. These signals or values are hereinafter referred to as fault information F, G. The fault information F and G are required for further processing in act S5, the fault information F additionally in a further act S6.

In an advantageous embodiment of the method, a procedure is used to determine the fault information F, G. Specifically, to determine the fault signal F, a minimum voltage magnitude Vmin and a maximum voltage magnitude Vmax are determined among the delta voltages $U_\Delta$ and the string voltages $U_Y$. Furthermore, the information is required which transformer type is present at the high voltage side.

If the minimum voltage magnitude Vmin corresponds to the first string voltage $U_{Y1}$ there is a fault on the first phase at the high voltage side for a Y transformer and a fault on the first delta voltage for a D transformer. If the minimum voltage Vmin is equal to the second string voltage $U_{Y2}$, there is a fault on the second phase at the high voltage side for a Y transformer and a fault on the second delta voltage for a D transformer. If the minimum voltage magnitude Vmin is equal to the third string voltage $U_{Y3}$, there is a fault on the third phase at the high voltage side for a Y transformer and a fault on the third delta voltage for a D transformer. The definitions of string voltages and delta voltages at the high voltage side are analogous to those at the low voltage side.

If, on the other hand, the minimum voltage magnitude Vmin corresponds to the first delta voltage $U_{\Delta 12}$, there is a fault on the second phase at the high voltage side for a D transformer and a fault on the first delta voltage for a Y transformer. If the minimum voltage magnitude Vmin corresponds to the second delta voltage $U_{\Delta 23}$, there is a fault on the third phase at the high voltage side for a Y transformer and a fault on the second delta voltage for a D transformer. If the minimum voltage magnitude Vmin corresponds to the third delta voltage $U_{\Delta 31}$, there is a fault on the first phase at the high voltage side for a Y transformer and a fault on the third delta voltage for a D transformer.

Also, a ground fault can be determined by comparing the maximum voltage Vmax with a so-called "ground indicator" GI. If the voltage magnitude Vmax is below the value GI, a ground fault is concluded. The size of the ground indicator GI depends on a sub-transient short-circuit power of the grid to which the transformer is connected with its high voltage side.

In subsequent acts S5 and S6, a magnitude of the zero-sequence voltage in the zero-sequence system u*0 at the high voltage side (act S5) and a phase ϕ*0 at the high voltage side of the zero-sequence system (act S6) are determined from the parameters determined so far and available as the result of the acts S3 and S4.

For this purpose, at S5, the fault information F, G as well as the voltages u*+ and u*− of the positive and negative sequence systems of the high voltage side are required. According to the disclosure, the following calculation rule is used for this purpose:

$$u*_0 = u*_- \cdot f,$$

wherein the factor f depends on the type of fault determined at S4. The factor f is thereby equal to $(u*+)^{1/2}$ (i.e., square root of u*+) if it is a single-pole ground fault, equal to 0 if it is a double-pole short circuit, and equal to u*−/u*+ if it is a double-pole ground fault.

If an exact fault determination was not possible at S4, the magnitude of the zero-sequence system u*0 is set to 0 and thus basically treated as a two-pole short circuit.

At S6, the phase angle ϕ*0 of the zero-sequence system at the high voltage side is determined in a similar way as in S5, using previously calculated quantities as well as the fault information F. The phase angle ϕ*0 is calculated as follows:

$$\Phi*_0 = \Phi*_- + \Delta\Phi,$$

wherein Δϕ is a phase offset that is 0° if there is a fault on the first phase of the high voltage side of the transformer or on the first delta voltage between the first and second phases at the high voltage side. The phase offset Δϕ is 120° if the fault is on the second phase or the second delta voltage between the second and third phases at the high voltage side. Finally, the phase offset Δϕ is −120° if the fault is on the third phase or the third delta voltage between the third and first phases.

After acts S5 and S6 have been carried out, the results of these acts and the result from act S3 provide a positive, negative and zero-sequence system (each in terms of magnitude and phase angle) that completely describe the voltage conditions at the high voltage side of the transformer. From the corresponding values u*+, u*−, u*0 and ϕ*+, ϕ*−, ϕ*0, the individual voltages at the high voltage side of the transformer are calculated in a final act S7 by a corresponding back transformation from the rotating to a static reference system.

The voltages calculated in this way can be used in subsequent acts, not shown in more detail here, to check whether there are grid faults at the high voltage side of the transformer to which the inverter must respond in accordance with specified guidelines, for example, by stopping a feed-in to the power supply grid or reducing it with respect to a power fed in or a current flowing.

Figure 3:
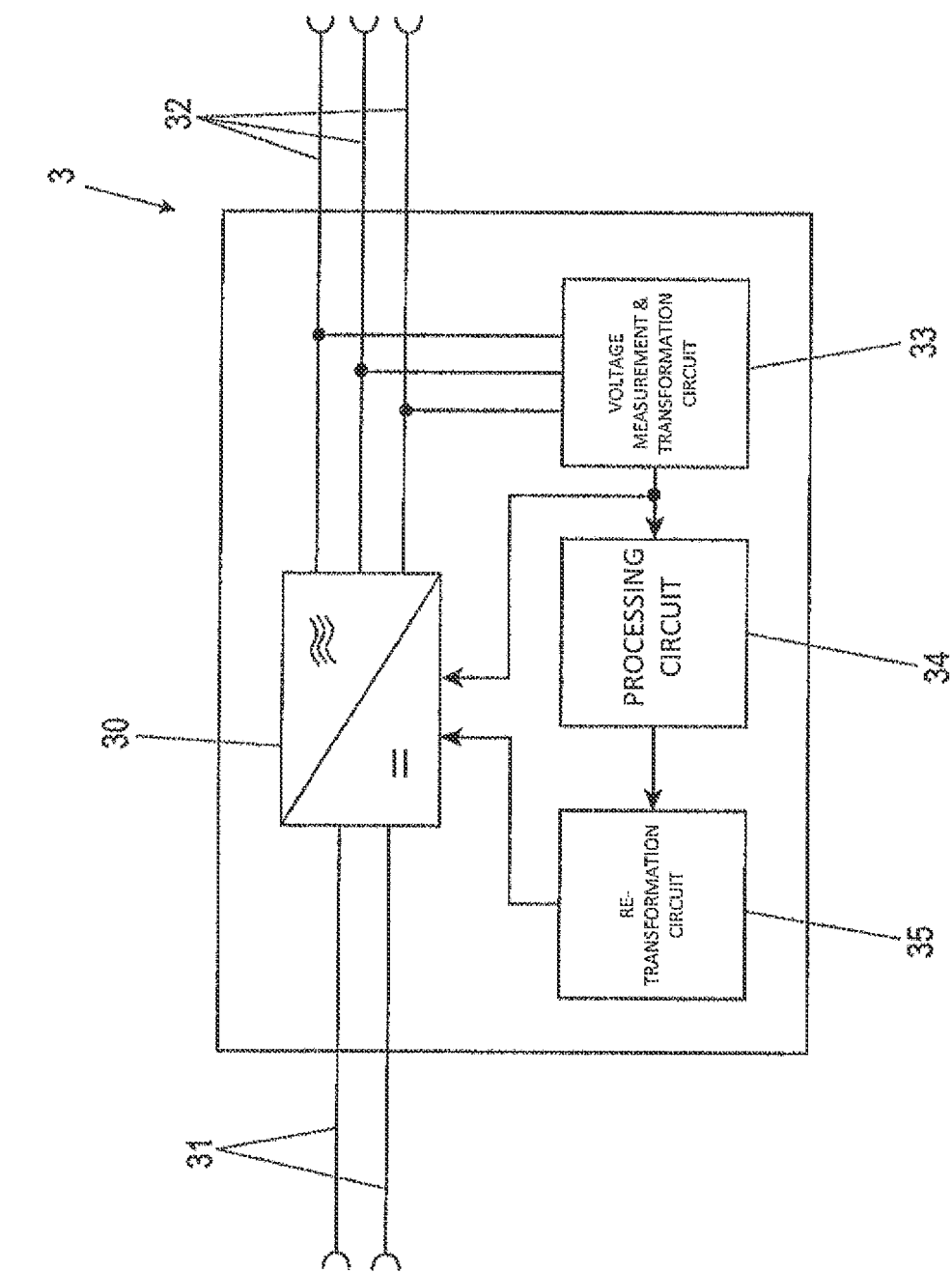
FIG. 3 a block diagram of an inverter with an integrated device according to the disclosure.

FIG. 3 shows, in the form of a block diagram, an embodiment of an inverter 3 with an integrated device for estimating voltages at a high voltage side of a transformer.

The inverter 3 shown in FIG. 3 can be used, for example, in the energy supply system shown in FIG. 1. It comprises as a main component a DC/AC converter 30, which has the main functionality of converting a direct current (DC) supplied on the input side at direct current inputs 31 into an alternating current (AC) provided on the output side at an alternating current output 32. As in the example of FIG. 1, the inverter 3 shown here has a three-phase design.

The inverter 3 further comprises a voltage measurement and transformation unit 33 connected to the AC outputs 32. This connection allows the voltage measurement and transformation unit or circuit 33 to measure the voltages and phase angles applied at a low voltage side of a transformer (cf. FIG. 1) connected to the AC output 32 as described in connection with act S1 of FIG. 2. Both the delta voltages $U_\Delta$ and the string voltages $U_Y$ can thereby be measured. It is also possible in one embodiment to measure only the string voltages $U_Y$ including corresponding phase angles $\phi_Y$ and to determine the delta voltages $U_\Delta$ therefrom.

Within the voltage measurement and transformation unit 33, the transformation of the string voltages $U_Y$ or phase angles $\phi_Y$ into corresponding values of a positive sequence voltage system and a negative sequence voltage system, as indicated in act S2 of FIG. 2, is also performed in accordance with one embodiment.

The measured and transformed values are transferred to a processing unit or circuit 34, which performs the processing acts indicated in connection with acts S3-S6 of FIG. 2. The values determined in these acts are transferred from the processing unit 34 to a retransformation unit or circuit 35, which performs the retransformation into voltage values of a stationary system according to act S7.

The estimated values of voltages at the high voltage side of the transformer calculated in this way are transferred to a control unit or circuit of the DC/AC converter 30 that can adjust its feed-in behavior according to the calculated values, for example, by stopping a feed-in to the power supply grid or reducing it with respect to a fed-in power or a flowing current if the calculated voltage values of the high voltage side of the transformer indicate grid faults.

The values determined by the voltage measurement and transformation unit 33 can additionally be transmitted to the control device of the DC/AC converter 30, since these values are generally required by the DC/AC converter as part of a pulse-wide modulation process to generate the sinusoidal output voltages or sinusoidal output currents.

The invention claimed is:

1. A method for an approximate determination of voltages at a high voltage side of a transformer based on measured voltages at a low voltage side of the transformer, comprising:
    measuring delta voltages and string voltages and phase angles at the low voltage side of the transformer using a voltage measurement and transformation circuit;
    transforming the string voltages and phase angles into positive and negative sequence voltages and phase angles of the positive and negative sequence systems, respectively, at the low voltage side of the transformer using the voltage measurement and transformation circuit;
    determining positive and negative sequence voltages and phase angles of the positive and negative sequence systems, respectively, at the high voltage side of the transformer from the positive and negative sequence voltages and phase angles of the positive and negative sequence systems, respectively, at the low voltage side of the transformer using a processing circuit;
    determining estimates of a zero-sequence voltage and a phase angle of a zero-sequence system at the high voltage side of the transformer from the measured delta voltages and string voltages and phase angles at the low voltage side of the transformer using the processing circuit; and
    transforming the positive, negative and zero sequence voltages and the phase angles into string voltages and/or delta voltages at the high voltage side of the transformer using a re-transformation circuit.

2. The method of claim 1, further comprising setting the positive and negative sequence voltages at the high voltage side of the transformer equal to the positive and negative sequence voltages at the low voltage side of the transformer.

3. The method of claim 2, further comprising adding a correction value to the positive and negative sequence voltages, respectively, to determine the positive and negative sequence voltages.

4. The method of claim 1, wherein the phase angles of the positive and negative sequence systems, respectively, at the high voltage side of the transformer are set from the phase angles at the low voltage side of the transformer, wherein a phase correction value is added that is n times 30° for the positive sequence system and n times −30° for the negative sequence system, and wherein n is an integer value that depends on.

5. The method of claim 4, wherein a value of n is selected depending on a transformer shift of the transformer.

6. The method of claim 1, wherein determining an estimate of the zero-sequence voltage and the phase angle of the zero-sequence system at the high voltage side of the transformer based on the measured delta voltages and string voltages at the low voltage side of the transformer comprises making a qualitative fault determination by which a presence of a fault on one or more of the phases of the high voltage side of the transformer is concluded and by which a ground fault of one of the phases of the high voltage side of the transformer is detected.

7. The method of claim 6, wherein making the qualitative fault determination comprises determining a minimum voltage from the measured delta voltages and string voltages, and comparing the measured delta voltages and string voltages with the minimum voltage to conclude a faulty phase at the high voltage side of the transformer.

8. The method of claim 6, wherein making the qualitative fault determination comprises determining a maximum voltage from the measured delta voltages and string voltages, and comparing the maximum voltage with a comparison value that is characteristic of a grid at the high voltage side to which the transformer is connected to conclude a ground fault at the high voltage side of the transformer.

9. The method of claim 8, wherein the comparison value is dependent on a sub-transient short circuit power of the grid.

10. The method of claim 6, further comprising determining whether a single-pole or a double-pole short circuit is present at the high voltage side of the transformer and/or whether a single-pole or a double-pole ground fault is present based on the qualitative fault determination.

11. The method of claim 10, wherein, in the presence of a single-pole ground fault, a value for the zero-sequence voltage at the high voltage side is set equal to a product of the negative sequence voltage and a square root of the positive sequence voltage.

12. The method of claim 10, wherein in the presence of a two-pole short circuit, the value for the zero-sequence voltage at the high voltage side is set equal to zero.

13. The method of claim 10, wherein in the presence of a two-pole ground fault, the value for the zero-sequence voltage at the high voltage side is set equal to a quotient of a square of the negative sequence voltage and the positive sequence voltage.

14. The method of claim 10, wherein the value for the phase angle in the zero-sequence system at the high voltage side is set equal to the phase angle in the negative sequence system at the high voltage side, plus a phase offset that is 0°, 120°, or −120°, depending on which phase at the high voltage side of the transformer the qualitatively determined fault is present.

15. A device for an approximate determination of voltages at a high voltage side of a transformer based on measured voltages at a low voltage side of the transformer, wherein the device is configured to:
   measure delta voltages and string voltages and phase angles at the low voltage side of the transformer;
   transform the string voltages and phase angles into positive and negative sequence voltages and phase angles of the positive and negative sequence systems, respectively, at the low voltage side of the transformer;
   determine positive and negative sequence voltages and phase angles of the positive and negative sequence systems, respectively, at the high voltage side of the transformer from the positive and negative sequence voltages and phase angles of the positive and negative sequence systems, respectively, at the low voltage side of the transformer;
   determine estimates of a zero-sequence voltage and a phase angle of a zero-sequence system at the high voltage side of the transformer from the measured delta voltages and string voltages and phase angles at the low voltage side of the transformer; and
   transform the positive, negative and zero sequence voltages and the phase angles into string voltages and/or delta voltages at the high voltage side of the transformer.

16. The device of claim 15, integrated into an inverter.

* * * * *